HIGH FREQUENCY DIODE WITH SMALL SPREADING RESISTANCE

Filed April 20 1964 3 Sheets-Sheet 1

INVENTORS
DEAN B. ANDERSON
RUDOLF R. AUGUST
JERRY C. AUKLAND
RICHARD L. PALMQUIST

HIGH FREQUENCY DIODE WITH SMALL SPREADING RESISTANCE

Filed April 20 1964 3 Sheets-Sheet 2

INVENTORS
DEAN B. ANDERSON
RUDOLF R. AUGUST
JERRY C. AUKLAND
RICHARD L. PALMQUIST

INVENTORS
DEAN B. ANDERSON
RUDOLF R. AUGUST
JERRY C. AUKLAND
RICHARD L. PALMQUIST

United States Patent Office 3,387,189

Patented June 4, 1968

3,387,189

HIGH FREQUENCY DIODE WITH SMALL SPREADING RESISTANCE

Dean B. Anderson, Whittier, Rudolf R. August, Orange, Jerry C. Aukland, Buena Park, and Richard L. Palmquist, Long Beach, Calif., assignors to North American Rockwell Corporation, a corporation of Delaware Filed Apr. 20, 1964, Ser. No. 361,069
8 Claims. (Cl. 317—234)

ABSTRACT OF THE DISCLOSURE

A high frequency diode comprising a diffused island of one conductivity type in a semiconductor body of the other conductivity type, the depth of the island being greater than the skin depth at the frequency of operation. The electric field through the p-n junction thus formed is substantially restricted to the peripheral region of the island. An ohmic contact surrounds the island and extends below the surface of the body to a distance essentially equal to the skin depth.

This invention relates to a diode; and more particularly to a high frequency diode and the operation thereof.

A "diode" is an electronic component having two electrical terminals or electrodes, the electric current having a preferred direction of flow, i.e., into one electrode, and out of the other electrode.

Diodes may be constructed in different ways to give them specific properties that are desirable for a particular operation. For example, some diodes are constructed to withstand a large voltage between their electrodes and other diodes are constructed to permit a large current to flow between their electrodes while still other diodes are constructed to become conductive, either abruptly or gradually, at particular values of applied voltage.

Due to the construction of diodes, they have an inherent electrical characteristic known as "capacitance," which depends in part upon the spacing between the two electrodes, and upon the proximal-area of the two electrodes. In most diodes, this inherent capacitance has a fixed value; but in the particular type of diode, known as a "varactor," the diode is formed in such a way that the inherent capacitance varies in accordance with the electrical signal applied across its terminals. It is the fact that the diode has variable capacitive reactance that gives the varactor diode its name.

The trend in electronics is to use ever higher frequencies and electronic components are constantly being improved to operate at such higher frequencies. The inherent capacitance of a high-frequency diode must be kept small and this need for a small inherent capacitance requires that the various capacity-producing areas be as small as practicable.

It is the principal object of the present invention to provide an improved diode that is capable of operating at extremely high frequencies. The attainment of this object and others will be realized from the following specification, taken in conjunction with the drawings of which FIG. 1 shows a prior-art "point-contact" diode;

Figure 1:
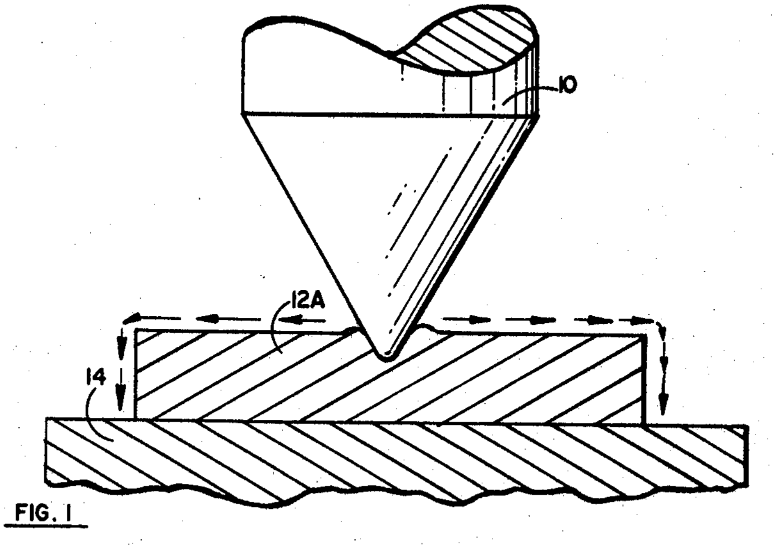

The basic operation of a "solid-state" diode will be understood from FIG. 1, which shows a prior-art "point-contact" diode. Reference character 10 indicates one electrode, in this case a very fine metallic wire about the thickness of a human hair, that has been sharpened to a point. The other electrode of the diode of FIG. 1 is a slab 12A of suitably doped, semi-conductive material, such as gallium arsenide or silicon. The term "doped" means that suitable materials have been introduced to provide desired P type and N type junctions.

It will be noted that the two electrodes 10 and 12A make contact at the point of the wire, giving rise to the designation "point-contact." The point contact area is also called the proximal area and due to the fineness of wire 10 and its sharp point, the proximal area is very small.

An electrically-conductive film 14, of metal such as gold, is affixed to the bottom of slab 12A, so that the metallic film 14 may act as an electric terminal. Film 14 has a very slow electrical resistance and is known as an "ohmic" contact.

In operation, an electric "displacement current" (as discussed in "Electromagnetics" by J. D. Kraus, page 318, McGraw-Hill, 1953) passes into the diode along electrode 10, passes through the proximal area between the point of electrode 10 and the slab 12A, passes through the thickness of slab 12A, and exits at electrical, or ohmic, contact 14.

Since wire 10 and ohmic contact 14 are metallic, they present a very low electrical resistance whereas slab 12A is a semi-conductive material that has a relatively high electrical resistance. Thus, most of the electrical resistance to the passage of electric current occurs in slab 12A and is known as the "spreading" resistance.

Mathematical analysis indicates that the relatively high spreading resistance of slab 12*a* tends to limit the upper operating frequency of the diode; and slab 12A is, therefore, made as thin as possible in order to reduce the spreading resistance. However, if slab 12A becomes too thin, it introduces other problems.

In the typical point contact (or mesa) diode, a junction is formed by the pointed wire and the semi-conductor material which acts like a variable capacitor. The distribution or effective part of this capacity is largely determined by the physical location of the metallic point and the metallic base contact to which the semi-conductor is affixed. Thus, the displacement current tends to run through the semi-conductor material from the metallic point to the metallic base much in the same manner as the displacement current tends to run through insulation between the metallic plates of a conventional capacitor.

High frequency operation of electronic devices is also generally limited by a characteristic known as "skin effect." The high frequencies involved are those commencing in the microwave field, 3 to 30 centimeters and extending into the shorter wavelengths of the optical spectrum. Skin effect introduces a resistance that becomes progressively more detrimental at progressively higher frequencies. At high frequencies, the current tends to run along the skin, or outer surface of a material, rather than passing through the body of the material. Thus, in the diode of FIG. 1, displacement current, instead of going from the point of electrode 10 through slab 12A to ohmic contact 14, tends at high frequencies to follow the periphery of slab 12A, as shown by the arrows. This means that for high-frequency operation, electric currents have a long and constricted (only skin-thick) path; both of these effects coacting to produce a high electrical resistance. Thus, the skin effect degrades the high frequency operation of the diode.

The point-contact diode of FIG. 1 has another disadvantage, namely its sharp point, which tends to render the diode unstable in operation. Moreover, in mass producing point contact diodes, it becomes difficult to consistently produce sharp points and contacts having exactly the same characteristics.

For the above reasons, the point contact diode FIG. 1 is not satisfactory for high frequency operation.

Figure 2:
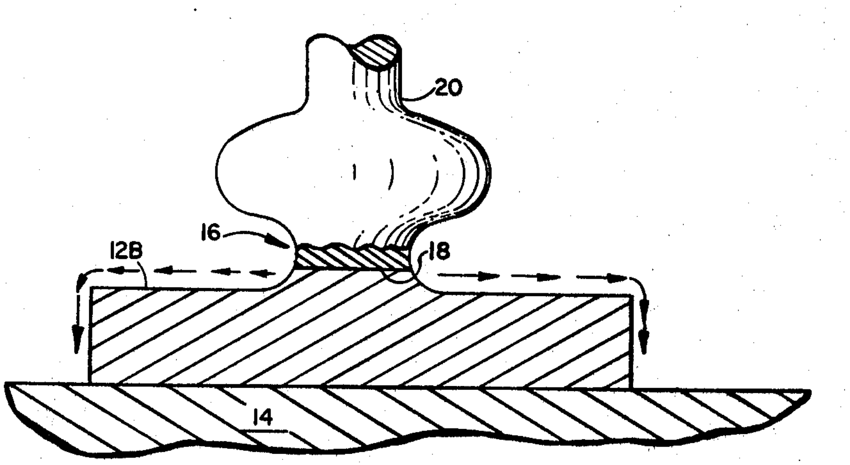
FIG. 2 shows a prior-art "mesa-type" diode.

Another approach to providing high-frequency diodes is the so-called "mesa" type diode shown in FIG. 2. Here the diode is made in such a way that it has a two region flat topped mesa 16. The variable capacitance proximal area consists of the boundary layer 18 between the two regions. One of the regions is a "P" type region, and the other region is an "N" type region, both regions being produced by suitable doping; and the boundary area 18 is therefore known as a "P-N" junction.

In operation, displacement current is introduced into the mesa type diode of FIG. 2 through lead wire 20. The displacement current flows through the P-N junction 18 and slab 12B, and out through the ohmic contact 14.

The mesa type varactor diode of FIG. 2 ordinarily has a "diffusion" type P-N junction, wherein the P and N type regions tend to merge into each other. This diffusion type junction provides more stable operation than the point contact diode of FIG. 1, but the mesa type diode still has the high frequency disadvantage caused by skin effect; it also has a relatively high spreading resistance.

It should be noted in passing, that in FIG. 1, the proximal area between the wire 10 and the slab 12A is also a P-N junction; that is, the wire 10 acts as the P region, while the slab 12A acts as the N region. However, in FIG. 1, the P-N junction is of the "abrupt" rather than the diffused type and, in part, limits the high frequency operation of the point contact type of diode.

The present inventive concept for providing high frequency diodes that are capable of operating in the "microwave" frequency region, and particularly at frequencies having a skin depth (as defined hereinbelow) of less than about 10 microns, will be understood from FIG 3. Slab 12C, of N type material, is treated in such a way (as by diffusing dopants into it) that an island micro-region 30 of the opposite type, e.g. P type material, is formed. However, it may be appreciated that N type material may be diffused into P type material. The proximal area of the P-N diffusion type junction 32 is the "hemispherical" area abutted by the island micro-region 30 and the material of slab 12C, as compared with the flat area of the mesa type diode. Such hemispherical configuration provides desirable electrical characteristics.

Figure 3:
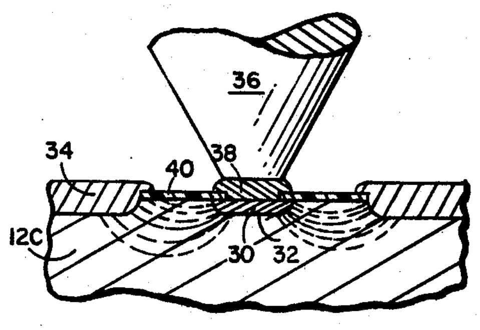
FIG. 3 is a schematic representation of a diode constructed in accordance with the present inventive concept.

Instead of having an ohmic contact at the bottom of the diode, as in the prior art arrangements, which would produce undesirable high spreading resistance, the arrangement of FIG. 3 has its ohmic contact in the form of a film 34 of high electrically-conductive material, such as gold in circumferential proximity to the island 30. Note that FIG. 3 shows contact 34 extending below the upper surface of slab 12C. Since the distance between island 30 and electrical contact 34 is very short, the peripheral spreading resistance is small.

The diode of FIG. 3 operates as follows. An electric signal is applied to the diode by means of wire 36, which may have an electrical contact 38 (made possibly of gold) that provides electrical contact with island 30. At high frequencies, the current flows from wire 36 through electrical contact 38 to island 30, and on through proximal area 32 and slab 12C, as shown by the dotted lines, to ohmic contact 34. The spreading resistance is thus primarily caused by the peripheral area and is very low permitting the diode to operate at a much higher frequency than prior-art arrangements.

In addition, the close spacing between island 30 and ohmic contact 34 minimizes skin effect resistance. In the arrangement of FIG. 3 the skin effect causes the displacement current at high frequencies to flow from island 30 to ohmic contact 34 through the short path therebetween. This short path provides minimal skin effects resistance, which improves the high frequency operation of the diode.

In addition, a planar film 40—of material such as silicon oxide—is formed between island 30 and electrical contact 34, to stabilize the P-N junction against the action of ambient materials, and to more clearly defiine the limits of the island and the ohmic contact.

It has been found that by using photo-masking, etching, diffusion, and other manufacturing techniques, as described in "Handbook of Semiconductor Electronics" by Hunter, Van Nostrand, 1958, and "Transistor Technology" by Bell Laboratories, Inc., McGraw-Hill, 1956, the size of island 30, and the positioning of films 34 and 40 can be very precisely controlled.

Figure 4:
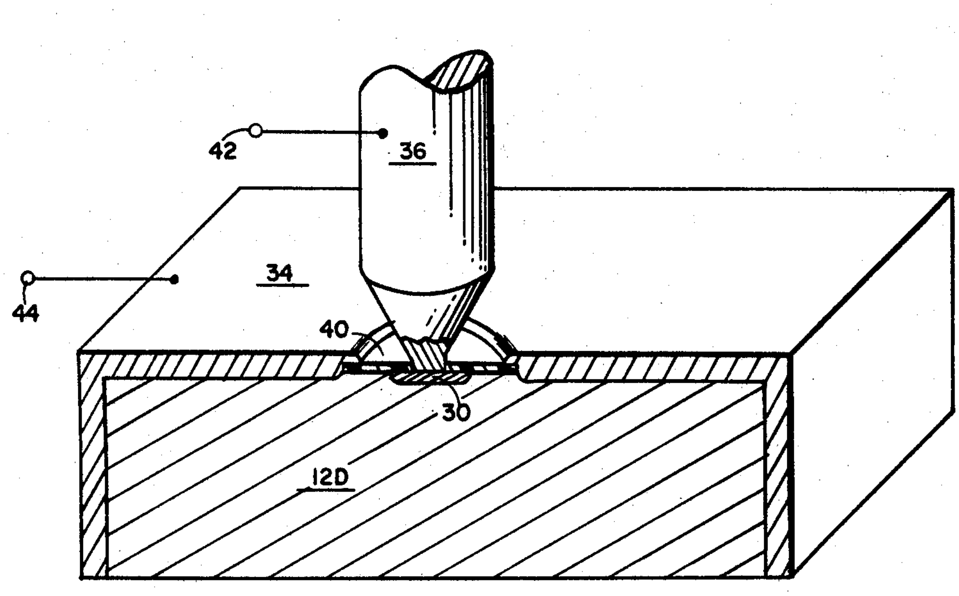
FIG. 4 is a pictorial view of a diode built in accordance with the teachings of the present invention.
Figure 6:
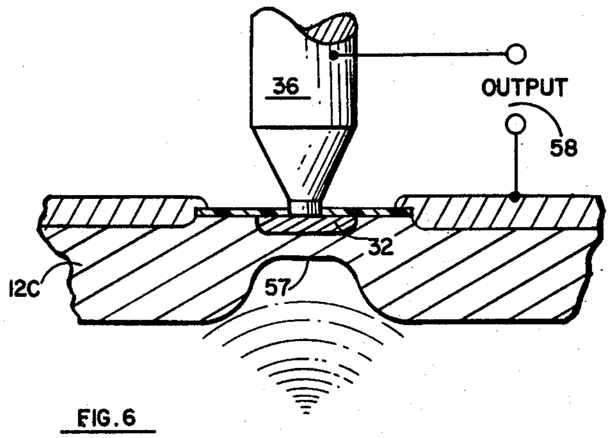
FIG. 6 is a light sensitive diode.

In a preferred embodiment, island 30 should have a diameter of about six microns. The ohmic contact 34 should have an aperture diameter of about 11 microns and film 34 should be about six microns thick, a micron being one-millionth of a meter, or about $\frac{1}{25,000}$ of an inch. As illustrated in FIGS. 3, 4 and 6, a portion of this thickness extends below the top surface of slab 12C. For the most part, the electrical field is confined to the junction at the sides of the island and does not extend to the junction at the bottom of the island. Thus, the depth of the area across which current flows is on the order of 4 or 5 microns.

In this way, the diode of FIG. 3 has a small proximal area which minimizes the skin effect, minimizes the spreading resistance experienced by the current flowing between the two electrodes, and thus permits the diode to operate at much higher frequencies than prior art arrangements. Moreover, the manufacturing techniques permit production of consistently reproducible high frequency diodes. Further, in a specific embodiment the depth of diffusion of the P type layer (or the N type layer in the cases where the P-N junction is formed in surrounding P type material) is not less than the skin depth. "Skin depth" is defined as the depth at which the field strength is 37% of the field strength at the surface or skin of the material, at the frequency of operation of the diode. By reason of diffusion to such depth or more, the field is substantially confined too near the surface of the semi-conductor and there is no substantial penetration of the field into the slab 12C through the bottom of island 30. Rather, the field lines are confined substantially to passing through the sides of the island to electrical contact 34. Thus, the skin depth should be limited to a depth of a few microns.

FIG. 4 shows a cut-away pictorial view of a diode corresponding to the structure of FIG. 3 but in which electrical contact 38 is not utilized. It will be noted from FIG. 4 that the active portion of the diode (the portion of the junction which is useful at high frequencies) is substantially planar and circular. Island 30 is in the form of a disc. The insulative silicon-oxide film 40 is a planar annulus, and the opening of ohmic contact 34 forms a circle that is coaxial with, equally spaced from, and circumferential with respect to island 30 and the P–N junction. This planar annular arrangement assures the desired spatial relations between the elements of the diode.

Alternately, the island may take the form of a line, while the opening of the ohmic contact takes the form of a concentric racetrack configuration, or, in another arrangement, the island may be a multi-lobed configuration, such as a square, a star, or a rosette, while the opening takes a corresponding shape.

While FIG. 4 shows the ohmic contact 34 to be an enveloping film, it may alternatively be a ring, or a ridge of suitable configuration.

In a particular embodiment, it may be desirable to dispense with the separate island 30, and to use instead the point of a wire in the manner shown in FIG. 1. In this case, the point of the wire acts as the island.

In use, the diode of FIG. 4 may be connected into an electrical circuit by means of terminals 42 and 44.

As previously indicated, a diode may be formed to have specific properties; the forming process primarily comprising control of the dopant and doping levels of the P, N, and P-N regions. Suitable control can produce a variety of diodes, for example, a diode that is capable of emitting light, a diode that is sensitive to light, a diode that is capable of acting as a switch, a so-called "backward" diode, a varactor-diode, and so on. A fuller discussion of the various types, uses, and formation of these diodes will be found in the above-cited books, and in others. Each of these types of diodes, and others, may advantageously take the form disclosed in the preesnt patent application; and will thus have its operation extended to considerably higher frequency.

For example, it will be recalled from earlier statements, that a varactor-diode is a particular type of diode wherein its capacitance may be varied by an external electrical signal. Varactors are widely used in electrical circuitry and a discussion of the theoretical and practical considerations will be found in "Varactor Applications" by Penfield and Rafuse, M.I.T. Press, 1962.

As previously indicated, the structure of FIG. 4 may be formed into a varactor diode by suitable control of the doping. The resultant varactor diode may operate in any of several modes; each capable of using higher frequencies than prior art devices. For example, in one mode of operation the inherent non-linearity of the inherent capacitance causes the varactor diode to generate a plurality of so-called "harmonic" frequencies and desired ones of these harmonic frequencies would be selected by suitable filters placed in the electrical circuitry. Another feature of the invention is one in which the diode is used in a microwave circuit. For example, the varactor provides a fixed frequency oscillator and is constructed so that it provides a given variable capacitance to cause oscillation of an electrical signal. Or, it might be used as a detector to amplify a received signal.

In microwave application, electrical contact film 34 of FIG. 4 extends to the bottom of slab 12D, and ohmic contact film 34 forms a cavity of desired dimensions. As is known to those skilled in the art, a cavity of this type tends to be resonant at a particular frequency; and this particular resonant frequency is that of the particular application.

It should be noted that the above-mentioned racetrack and rosette shapes provide cavities of different configurations, which are thereby resonant to different frequencies.

Where desired, a biasing voltage may be applied to terminals 42 and 44 in order to control the operating characteristics of the varactor diode.

Another mode of operation causes the varactor diode to act as an amplifier or detector. In this mode of operation, the signal to be amplified is applied between terminals 42 and 44 and a "pumping" signal is applied in such a manner that it appears across the gap between the island 30 and the electrical contact 34.

Figure 5:
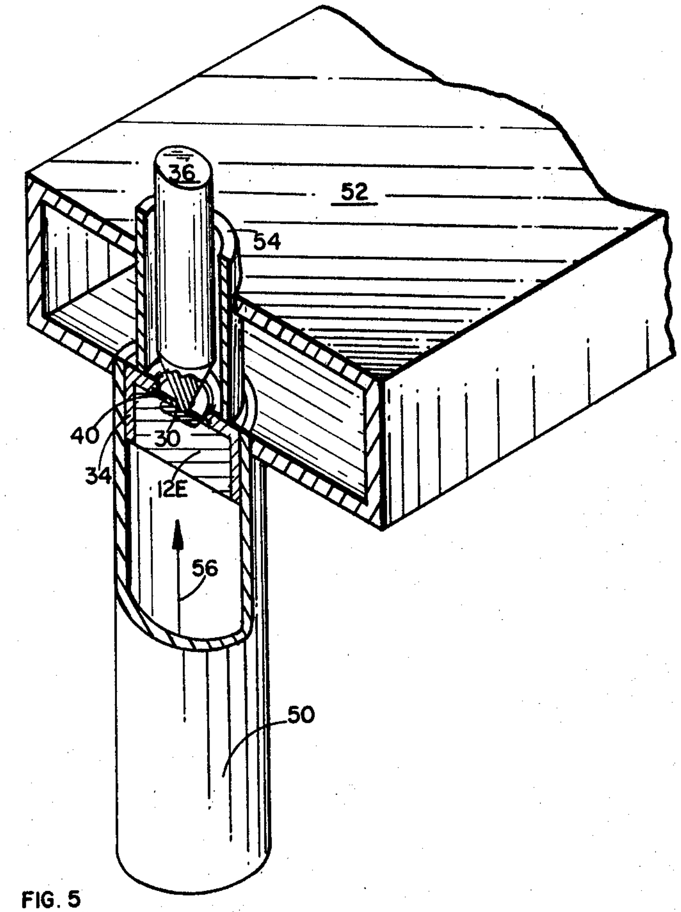
FIG. 5 is a schematic representation of a varactor-diode built and incorporated into a waveeguide structure in accordance with the teaching of the invention.

FIG. 5 shows one structure for using the varactor diode as a parametric type amplifier or detector. Here the varactor diode is fitted into a waveguide 50, whose function will be explained later. Slab 12E, as before, has its top and sides covered with an ohmic-contact film 34 of metallic material and in this case the metallic film 34 is in electrical contact with the metallic wall of waveguide 50, which is in turn fitted into, and in electrical contact with, the wall of a second waveguide 52. Island 30, insulating annulus 40, and wire 36 have the same structure and function as previously described. A tube 54, of dielectric material such as glass, serves to support wire 36 and to hold it with respect to the upper wall of wave-guide 52. Wire 36 is, however, electrically coupled thereto.

In operation, the input signal to be amplified (which may be in the $TE_{01}$ mode in the figure) is directed through waveguide 52, shown as having a rectangular cross section. Wire 36 is positioned in waveguide 52 and acts as a "probe" which picks up the signal and causes a flow of displacement current to the island 30 of the varactor diode, and out of the ohmic contact 34. A pumping signal having radial polarization is directed, as shown by arrow 56, through waveguide 50 which is shown as having a circular cross-section. The characteristics of waveguide 50 causes the energy propagating therethrough to impinge upon, and to be absorbed by slab 12E. The absorbed energy of the pumping signal appears across the gap of the varactor diode and varies the inherent capacitance. Such variation causes the input signal to be amplified. The output signal exists in the waveguide and may be isolated from the input signal by any well-known means such as by a ferrite isolator. Alternatively, the signal may be extracted coaxially using the potentials between the wire probe and the film 34.

Alternatively, the pumping signal may comprise illumination or suitable radiation impinging on the slab; or it may comprise an electrical signal such as shown in FIG. 4.

Thus, a weak microwave signal of extremely high frequency, such as a radar echo signal, can be amplified by the disclosed varactor diode.

FIG. 6 discloses a light sensitive device utilizing the high frequency diode of the invention. Slab 12C of N type material has therein a depression 57 disposed near to the junction between the P type material of island 30 and the N type material of 12C. The capacitance of the diode will vary in accordance with the variation of intensity of the light and such varied capacitance may be sensed as output 58. Other coupling may of course be used as set forth, for example, that of FIG. 5 to feed a simultaneous high frequency signal to the varactor diode.

Although the invention has been illustrated and described in detail, it is to be clearly understood that the same is by way of illustration and example only, and is not to be taken by way of limitation; the spirit and scope of this invention being limited only by the terms of the appended claims.

We claim:

1. A diode for operation at microwave frequencies, said diode comprising:

an island micro-region of a first conductivity type material diffused into a surface of a body of semconductive material of opposite conductivity type to provide a junction of P type and N type materials; and an electrical contact positioned on said body in an annular, circumferential manner with respect to said island micro-region, said island micro-region of first type material diffused to a depth greater than the skin depth such that the electric field at said microwave frequencies is substantially limited to that portion of the junction at the sides of said island micro-region.

2. A microwave diode comprising:

an island micro-region of a first type of material diffused into a surface of a body of a semi-conductive second type of material to provide a junction of P type and N type materials, wherein said first type of material is diffused into said second type of material to a depth not less than skin depth in relation to the frequency of operation of said diode;

a planar electrical contact positioned on said body in a circumjacent manner with respect to said junction, said contact having an annular configuration and being substantially concentric with said junction; and means for causing a microwave electric field between said island micro-region and said contact, said microwave electric (high frequency electrical) field being confined substantially to that portion of the junction at the sides of said island and wherein substantially all of the current flow is within four to five microns of the surface of said diode.

3. The diode recited in claim 2 wherein the thickness of said second type of material below said island micro-region is sufficiently thin to allow said junction to receive light energy.

4. A diode comprising:

an island micro-region of a first type of material diffused into the body of a second type of material to provide a junction of P type material and N type material;

a first means for making electrical contact with said first type of material;

a second means on said body for making electrical contact with said second type of material, said second means for making electrical contact being circumferentially positioned with respect to said junction;

means for providing a high frequency electrical field between said first (type of material) and said second means for making electrical contact;

said electrical field being confined substantially to that portion of said junction at the periphery of said micro-region;

said first type of material having a depth of (pentration substantially) diffusion greater than the skin depth of penetration of said electrical field.

5. A high frequency diode having a microwave frequency operating range, the diode comprising a body of semiconductor material of one conductivity type, an island micro-region of semiconductor material of the other conductivity type diffused into said body forming a diffused p-n junction and an ohmic contact on the body surrounding the said island micro-region, the depth of the diffused junction being not less than the skin depth at the lower end of the said operating range, whereby the current flow through the junction is substantially limited to the part of the junction around the periphery of the island.

6. The diode defined in claim 5 wherein said island is circular and said contact is annular and concentric to said island, whereby the electric field within said body is substantially limited to the (tubular) semiconductor region between said island and said contact.

7. The diode defined in claim 5 wherein the surface of said body between said island and said ohmic contacts is covered by an insulating layer.

8. The diode defined in claim 7 wherein the diameter of said island is on the order of 6 microns, the depth of said island is on the order of 4 microns, and the aperture diameter of said contact is on the order of 11 microns.

References Cited

UNITED STATES PATENTS

| | | | |
|---|---|---|---|
| 2,864,980 | 12/1958 | Mueller et al. | 317—234 |
| 2,970,275 | 1/1961 | Kurzrok | 330—4.9 |
| 2,999,940 | 9/1961 | Hoffman et al. | 317—234 |
| 3,013,955 | 12/1961 | Roberts | 317—234 |
| 3,114,881 | 12/1963 | Uenohara | 330—4.9 |
| 3,119,073 | 1/1964 | Harris | 330—4.9 |
| 3,184,823 | 5/1965 | Little et al. | 317—234 |
| 3,304,430 | 2/1967 | Biard et al. | 317—234 |
| 3,114,864 | 12/1963 | Sah | 317—235 |
| 3,169,197 | 2/1965 | Memelink | 317—235 |

ROY LAKE, *Primary Examiner.*

DARWIN R. HOSTETTER, *Examiner.*

UNITED STATES PATENT OFFICE

CERTIFICATE OF CORRECTION

Patent No. 3,387,189 June 4, 1968

Dean B. Anderson et al.

It is certified that error appears in the above identified patent and that said Letters Patent are hereby corrected as shown below:

Column 6, line 67, cancel "(high frequency electrical)". Column 7, line 12, cancel "(type of material)"; lines 17 and 18, cancel "(penetration substantially)". Column 8, line 4, cancel "(tubular)".

Signed and sealed this 9th day of December 1969.

(SEAL)
Attest:

Edward M. Fletcher, Jr.
Attesting Officer

WILLIAM E. SCHUYLER, JR.
Commissioner of Patents